United States Patent [19]
Bolde et al.

[11] Patent Number: 5,971,058
[45] Date of Patent: Oct. 26, 1999

[54] APPARATUS AND METHOD FOR CONTINUOUS CASTING SOLDER ONTO DISCRETE PARTS

[75] Inventors: Lannie R. Bolde, New Paltz; James H. Covell, II, Poughkeepsie, both of N.Y.

[73] Assignee: International Business Machines Corporation, Armonk, N.Y.

[21] Appl. No.: 08/876,140

[22] Filed: Jun. 13, 1997

[51] Int. Cl.[6] .................................................. B22D 33/04
[52] U.S. Cl. .................. 164/130; 164/113; 164/324; 164/452; 164/155.4; 164/137
[58] Field of Search .................................. 164/130, 113, 164/324, 452, 155.4, 137

[56] References Cited

U.S. PATENT DOCUMENTS

| | | | |
|---|---|---|---|
| 3,627,019 | 12/1971 | Hitchcock et al. | 164/130 |
| 4,164,064 | 8/1979 | Reavill | 29/468 |
| 5,145,691 | 9/1992 | Kazwakami et al. | 425/110 |
| 5,238,174 | 8/1993 | Ricketson et al. | 228/180.21 |
| 5,244,143 | 9/1993 | Ference et al. | 228/180.21 |
| 5,307,978 | 5/1994 | Ricketson et al. | 228/4.5 |
| 5,673,846 | 10/1997 | Gruber | 164/113 |

Primary Examiner—Harold Pyon
Assistant Examiner—I. -H. Lin
Attorney, Agent, or Firm—Delio & Peterson LLC; John J. Tomaszewski; Aziz M. Ahsan

[57] ABSTRACT

An apparatus and method are provided for continuously injecting molten solder into a plurality of molds for transfer of the formed solder mounds to electronic devices such as multilayer ceramic packages. A conventional injection molding apparatus is employed with a specially designed apparatus for forming the molds and preferably with a specially designed mold to provide a continuous molding process. The apparatus is preferably of a U-shaped configuration whereby molds are advanced under the molten solder reservoir and injection head by a preceding mold in the apparatus. The urging action of the preceding mold on the succeeding mold and, preferably in conjunction with the preferred mold design, enables a continuous method and apparatus for injecting molten solder into a plurality of molds. The preferred mold design utilizes an upper plate having mold opening, and a lower substrate or backing plate, with the length and width of the upper plate being slightly longer than the length and width of the lower substrate or late.

8 Claims, 3 Drawing Sheets

APPARATUS AND METHOD FOR CONTINUOUS CASTING SOLDER ONTO DISCRETE PARTS

BACKGROUND OF THE INVENTION

1. Field of the Invention

The present invention relates to a method and apparatus for continuous casting solder onto discrete parts and to solder containing parts formed thereby and, in particular, to a continuous process for injecting molten solder into molds to form solder mounds and wherein the molds may be disposed against a substrate such as a multilayer ceramic package or other electronic substrate and the solder mounds then transferred from the mold to the substrate or the molds disposed against a backing plate with the molded solder mounds transferred from the mold to another electronic substrate.

2. Description of Related Art

Forming an electronic package whereby an electrical component such as a multilayer ceramic package is electrically connected to a substrate such as a card, a board, another connector and any other electronic part is well-known in the art. Surface mount technology (SMT) has gained acceptance as the preferred means of joining electronic devices together, particularly in high end computers. As circuit densities increase there is an increased demand for more I/O and the interconnections which are solder bonded must be smaller and more closely spaced. Additionally, the height of each interconnection must be distributed within a relatively small height tolerance to insure that all of the multilayer ceramic package locations will be electrically interconnected to a corresponding substrate contact location through the solder interconnections.

A myriad of solder structures have been proposed for surface mounting of one electronic structure to another. A typical surface mount process is performed by screening solder paste on conductive, generally metallic pads exposed on a surface of a first electronic structure or substrate. Other known surface mount technology uses solder balls rather than solder paste to provide the solder connecting structures. This technology is known as C-4 and by using solder balls, a more exact and somewhat greater quantity of solder can be applied then through screening. These type solder structures are used mainly to connect a chip to a multilayer ceramic package.

Another type of solder interconnection is a cast solder column which is mainly used to connect a multilayer ceramic package to a boar. Cast columns (CGA) are preferred over pin grid arrays (PGA) in that the nature of the joint (solder connection) offers a better electrical connection over the PGA, is less expensive to manufacture and compensates for thermal expansion differences between the ceramic package and the board. In general, pins are prefabricated and then attached to the bottom side of the package substrate. Sockets are attached to the board where the PGA is plugged in. The PGA process is costly compared to the IMS cast column process.

In the present wire column grid array process a eutectic paste is screened on the substrate pads, typically the bottom surface metallurgy (BSM) pads. The solder columns are loaded separately into a mold or formed in the mold and then aligned to the substrate BSM pads and reflowed. This two-step procedure leads to increased manufacturing cost and possible misalignment of columns to the BSM pads.

U.S. Pat. No. 5,244,143, to Ference et al. and assigned to the assignee of the present invention, the disclosure of which is hereby incorporated by reference, discloses an apparatus and method for injection molding solder mounds onto electronic devices. In general, the apparatus has a reservoir for molten solder which is disposed over a cavity in an injection plate. The injection plate is disposed over a mold having an array of cavities therein into which solder is injection molded. The mold is typically disposed over a workpiece such as a multilayer ceramic substrate and the cavities in the mold are aligned with electrical contact locations on the chip or substrate. The workpiece is heated and the molten solder is forced under gas pressure into the cavity in the injection plate disposed above the array of cavities in the mold and the molten solder is forced into the cavities. In one embodiment, the injection plate is advanced to slide over the stationary mold to wipe away the excess solder above the mold at a plurality of wiping apertures in the injection plate. The injection plate is then further advanced to a location having a nonsoldered wettable surface at which location the injection plate is removed. The mold is then removed to leave solder mounds disposed on the workpiece.

The above apparatus and method can also be used with a fixed injection molding apparatus and injection plate and moving the mold and workpiece. The apparatus and method of the patent can also be used in an automated manufacturing system for depositing an array of solder mounds onto substrates. For an automated system the patent describes using intermeshing conveyer belt loops to provide a completely automated apparatus and process for disposing solder mounds onto electronic devices. A more advanced embodiment is a reel to reel apparatus and process for Tape Automated Soldering.

In the injection molded solder process (IMS), molds such as column grid array (CGA) molds are passed under an injection head or plate which fills the mold with molten solder. The injection head must make direct contact with the surface of the mold while the solder is in a molten state to force solder into the mold cavities and to prevent solder which is in a reservoir on top of the injection head from spilling out. This is a problem when the injection head is lifted to injection mold additional parts moved under the head and it has been proposed that before the injection head is lifted that the molten solder in the reservoir be allowed to solidify. A second proposal utilizes a vacuum on the reservoir to lift and hold the molten solder prior to lifting the injection head. Both solutions are impractical in a manufacturing environment where continuous processing is highly desirable. In alternative processes where the injection head is not raised during the process to mold additional parts it has been found that conveyor belts and the like are not satisfactory because of the competing thermal (cooling and heating) forces inherent in the process which provide gaps between the molds being sequentially processed and/or other problems in feeding and injecting molten solder into the mold.

Bearing in mind the problems and deficiencies of the prior art, it is an object of the invention to provide a continuous process for injecting molten solder into a plurality of molds sequentially using such processes as the injection molded solder (IMS) process.

A further object of the invention is to provide an apparatus which may be operated continuously to fill a plurality of molds sequentially with molten solder using processes such as the injection molded solder (IMS) process.

It is an additional object of the invention to provide substrates and in particular electronic substrates such as multilayer ceramic packages with injection molded solder mounds thereon prepared by the process and method of the invention.

Other objects and advantages of the present invention will be readily apparent from the following description.

SUMMARY OF THE INVENTION

The above and other objects, which will be apparent to those skilled in the art, are achieved in the present invention which is directed in a first aspect to a method for continuously injecting molten solder into a plurality of molds preferably of the same dimension sequentially using known processes such as the injection molded solder process of U.S. Pat. No. 5,244,143, supra, which uses a reservoir containing molten solder and a communicating injection head and an injection plate comprising advancing a plurality of molds arranged in sequential abutting relationship wherein each mold has a leading edge and a trailing edge, which molds comprise an upper plate having a plurality of cavities and a backing plate or a substrate plate, along a substantially planar horizontal passageway by passing a mold to be filled under the injection plate, which plate rests on the upper surface of the upper plate of the mold, until the cavities are filled with molten solder, by advancing, preferably pushing, the leading edge of the next sequential mold to be filled against the trailing edge of the mold to be filled a distance along the passageway which distance is the length of the mold wherein after the mold is filled the next sequential mold will then be in position to be filled. In this method there will be no significant gaps between the trailing edge of the just filled mold and the leading edge of the next sequential mold to be filled so that the injection plate does not need to be lifted or otherwise moved and a continuous process is provided with the molds being processed in sequence.

In an additional aspect of the invention, a method for injecting molten solder into a plurality of molds from an assembly comprising a reservoir containing molten solder and a communicating injection head and an injection plate the method comprising:

advancing a plurality of molds having preferably the same dimensions and a leading edge and a trailing edge sequentially depending on a control signal determined by the processing rate desired along a U-shaped substantially horizontal planar passageway comprising a first passageway, an intersecting transverse second passageway and the second passageway intersecting a third passageway parallel to the first passageway;

advancing the molds along the first passageway to a first intersection at the intersection of the first and second passageways with preferably a single mold being positioned in the first intersection;

advancing the single mold from the first intersection along the second passageway to a second intersection at the intersection of the second and third passageways;

advancing along the third passageway the leading edge of the single mold against a trailing edge of a mold positioned on the third passageway in abutting relationship to the other molds on the passageway a distance whereby the trailing edge of the mold on the passageway is moved a distance equal to the length of the single mold;

forcing molten solder into an advancing mold which passes under the injection head and filling the mold with the molten solder;

generating a control signal to control advancing of the molds; and repeating the above steps until all the molds are filled with solder.

In another aspect of the invention, an apparatus for continuous casting solder onto discrete parts (molds) comprises:

a preferably U-shaped substantially horizontal planar passageway comprising a first passageway having an inlet at one end and an intersecting transverse second passageway at the other end of the first passageway and a third passageway parallel to the first passageway having an outlet at one end and intersecting the second passageway at the other end;

first advancing means for moving a plurality of molds having a leading edge and a trailing edge preferably in abutting relationship along the first passageway to a first intersection at the intersection of the first and second passageways in which first intersection preferably a single mold is positioned;

second advancing means for moving the single mold in the first intersection along the second passageway to a second intersection at the intersection of the second and third passageways;

third advancing means for moving the leading edge of the single mold from the second intersection along the third passageway against the trailing edge of a mold positioned on the third passageway in abutting relationship to the other molds on the passageway a distance whereby a mold on the third passageway is moved a distance equal to the length of the single mold;

molten solder means which rests on the surface of a mold and fills the advancing mold with molten solder;

control means for controlling advancement of the molds; and removing the filled molds from the outlet means.

In another aspect of the invention, the U-shaped substantially horizontal planar first passageway comprises an air track and/or gravity advancing means to advance molds along the first passageway to the first intersection. A shuttle arm which is preferably a pushing device moves a single mold in the first intersection along the second passageway to the second intersection and then retracts to accommodate the next sequential mold on the first passageway which is advanced into the first intersection from the first passageway. An advancing mechanism preferably a pushing mechanism urges the single mold from the second intersection along the third passageway against an abutting mold already on the third passageway a distance equal to the length of the single mold. The U-shaped passageways preferably have retaining walls to maintain the molds in the proper alignment on the passageways.

In a further aspect of the invention, the mold is provided with a backing plate and/or substrate to which the solder mound will be deposited with the X/Y dimensions of the upper plate of the mold being slightly larger than the X/Y dimensions of the backing plate and/or substrate. It is also important that the height (Z) of the mold assembly (mold and backing plate) be in essentially the same plane—the same height.

In another aspect of the invention, substrates such as ceramic multilayer packages or other electronic substrates are provided having solder mounds thereon prepared by the method and/or apparatus of the invention.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
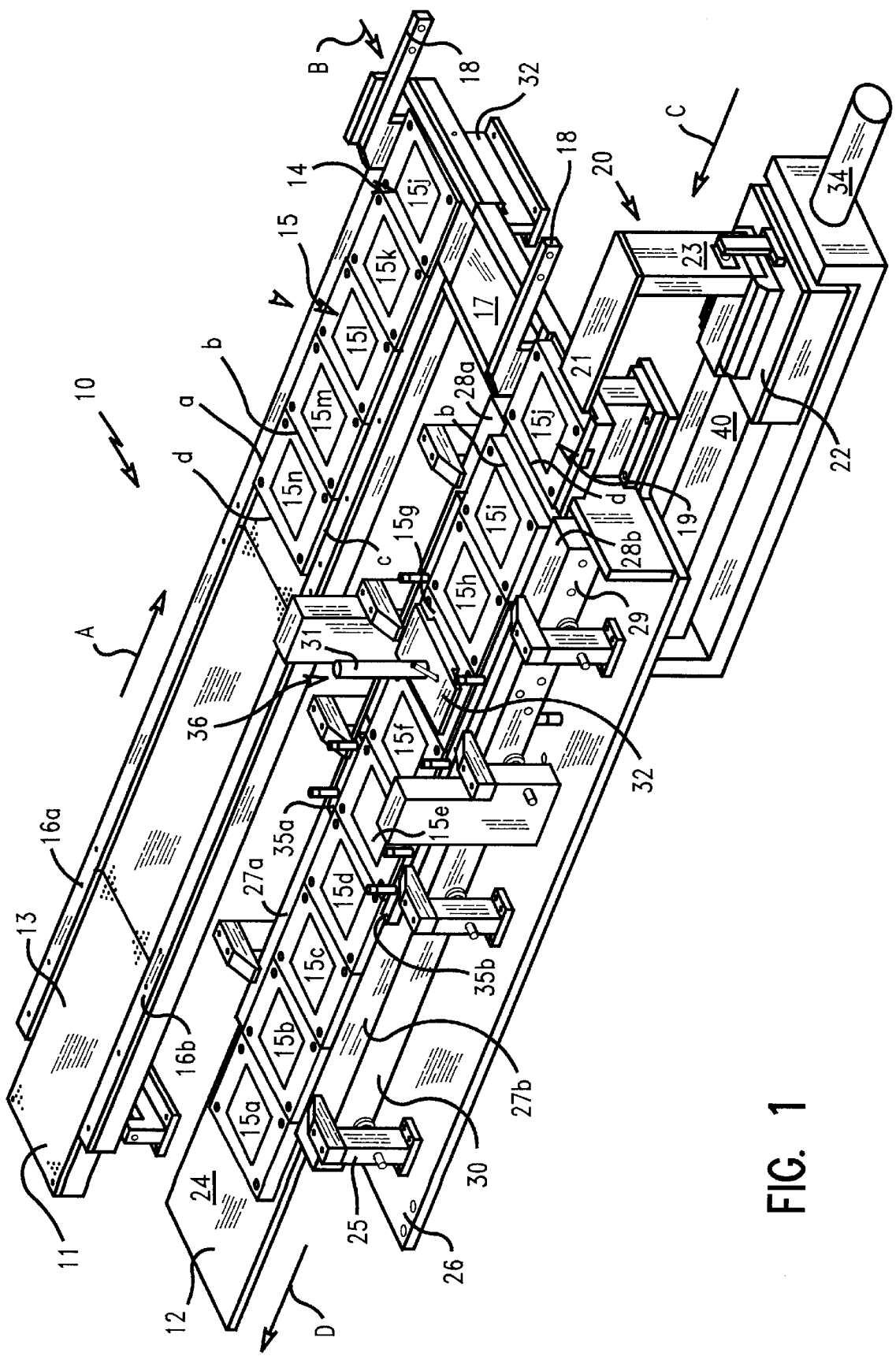
FIG. 1 is a perspective view of the apparatus of the invention.

In describing the preferred embodiment of the present invention, reference will be made herein to FIGS. 1–3 of the drawings in which like numerals refer to like features of the invention. Features of the invention are not necessarily shown to scale in the drawings.

FIG. 1 shows a perspective view of a preferred apparatus of the invention. The apparatus has an inlet 11 and an outlet 12 onto which molds are introduced and withdrawn, respectfully. Advancement of the molds in the apparatus are shown by arrows A, B, C, and D. The apparatus has a rectangular first passageway 13 which extends to first intersection 14. Second passageway 17 is transverse to first passageway 13 and intersects first passageway 13 at first intersection 14. First intersection 14 is preferably sized so that a single mold 15 fits within the intersection. Second passageway 17 intersects third passageway 24 which third passageway is parallel to first passageway 13, at second intersection 19. A plurality of mold assemblies 15a–15m are shown positioned on first passageway 13, at first intersection 14, at second intersection 19 and on third passageway 24. Note that mold 15j in first intersection 14 and mold 15j in second intersection 19 are the same mold as will be explained bellow. The passageways are sized to be essentially the same width as a mold assembly which is shown as square, although rectangular molds could be used with appropriate modification to the apparatus. First passageway 13 is shown having opposed walls 16a and 16b to keep the molds 15 in alignment on the passageway during travel of the mold along first passageway 13. The molds are shown having edges a, b, c and d with the leading edge of the mold being defined as the transverse edge moving in the direction of the arrows on each passageway and which edge is closer to the outlet 12. The trailing edges are defined as the opposed edge. Thus, on the first passageway edge b is the leading edge and edge d is the trailing edge. On the third passageway, edge d is the leading edge and edge b is the trailing edge.

A first shuttle arm 18, which may be operated by an air cylinder or other moving means, is shown positioned adjacent first intersection 14 along the longitudinal axis of first passageway 13 and is used to push a single mold 15 (15j) from first intersection 14 along second passageway 17 to second intersection 19. In FIG. 1, the single mold 15j and first shuttle arm 18 are shown for clarity in both the initial position in intersection 14 and in the extended position in second intersection 19. After the single mold 15j has been moved to second intersection 19 the first shuttle arm 18 will be automatically retracted to first intersection 14 for the reception of the next sequential single mold (15k) into first intersection 14 for the mold to be moved from first intersection 14 to second intersection 19 when the shuttle arm 18 is activated.

A second shuttle assembly 20 is shown having a blade portion 21, a support carriage 22 and an arm 23 connecting carriage 22 and blade 21. The second shuttle arm 20 is movably carried on carriage 40. In operation, the second shuttle arm assembly 20 is moved by motor 34 along carriage 40 and pushes the trailing edge b of single mold 15 (15j) which is positioned in second intersection 19 from second intersection 19 along third passageway 24. As will be explained in more detail later, the single mold pushed from second intersection 19 along third passageway 24 will push (advance) the molds already positioned in abutted sequence on third passageway 24 a distance equal to the length of mold 15. This is accomplished by the leading edge d of mold 15j contacting the trailing edge b of mold 15i and then moving the abutted molds on third passageway 24 a distance equal to the length of the mold (a or c). The molds are shown having sides a, b, c, and d which are the same since the mold is square. As noted above, the molds can be rectangular.

Third passageway 24 is supported by base 26 and support columns 25. A cooler 30 is shown having opposed sides 27a and 27b which run parallel to and under the length of third passageway 24. Likewise, heater 29 having opposed sides 29a and 29b also run parallel to and under the length of third passageway 24. Heater sides 29a and 29b and cooler sides 27a and 27b extend slightly above the plane of third passageway 24 and act as sidewalls which guide the molds 15 in proper alignment along third passageway 24. Opposed guides 35a and 35b also guide the molds along third passageway 24.

An injection molding assembly is shown generally as 36 and comprises a solder reservoir and injection head 31 and injection plate 32. As will be shown in more detail hereinbelow, the injection plate 32 rests on the surface of mold 15 and molten solder 41 from reservoir and injection head 31 is injected into openings or cavities in the mold 15 (15g) as the mold is being advanced under the injection plate.

First passageway 13 and second passageway 17 are shown supported by columns 32. The apparatus 10 is substantially horizontal and substantially planar and forms a U-shaped configuration. In general, in operation, molds 15 are introduced into the apparatus at inlet 11 and moved as shown by arrows A, B, C and D in abutting sequential sequence along first passageway 13 to first intersection 14 where a single mold is disposed. It is preferred that first passageway 13 have openings along the passageway so that air can be forced upward through the openings to move the molds along by an air track system. It is also preferred that the first passageway be inclined slightly downward toward first intersection 14 to assist in moving the molds in abutting sequence along first passageway 13.

A number of molds are abutted sequentially along first passageway 13 with one mold (15j) being positioned in first intersection 14. When another mold is to be processed, the first shuttle arm 18 is activated and moves mold 15j from first intersection 14 along second passageway 17 to second intersection 19. The first shuttle arm 18 then retracts to its original position and a preceding (or next) mold 15k is moved into position in first intersection 14. When the mold 15j in second intersection 19 is to be moved along third passageway 24 the second shuttle arm assembly 20 is activated and pushes the mold 15j from second intersection 19 along third passageway 24 and the leading edge d of mold 15j contacts a trailing edge b of mold 15i already on third passageway 24. The length of stroke of second shuttle arm assembly 20 is such that the abutting molds already on third passageway 24 are moved the length (a or c) of one mold so that a mold positioned on the third passageway is advanced under injection molding assembly 36 for filling the mold with molten solder. After a mold is moved from second intersection 19 onto third passageway 24, the second shuttle assembly 20 is retracted to its original position opening second intersection 19 for the reception of another mold (in this case 15k) from first intersection 14. This procedure is repeated until the process is completed.

As will be understood by those skilled in the art, in operation, the heaters 29 as well as coolers 30 are operating to heat and cool the molds, respectively. Accordingly, the molds are heated and the solder is molten in reservoir 31. When the mold 15 is advanced under injection plate 32, molten solder from reservoir and injection head 31 is forced into openings in mold 15 filling the openings. After filling of a mold, the apparatus is automatically activated by a sensing mechanism and as shown mold 15j would be pushed along third passageway 24 from second intersection 19 and pushes a new mold 15h under reservoir and injection head 31 for filling. The reservoir and injection head 31 are maintained under pressure and solder is then injected into the openings in the new mold 15h as the mold is advanced under injection plate 32 and reservoir and injection head 31.

It is a preferred feature of the invention that the molds 15 be specially configured so that the injection molding apparatus 36 need not be lifted during operation and that the injection molding assembly 36 rest on the surface of the mold during operation. Because of the special mold configuration and apparatus and method of the invention, substantially no significant amount of solder is spilled or lost other than to fill openings in molds 15. Because of this operation, the injection molding process is continuous and a number of molds can be processed sequentially with efficiency and enhanced process economics.

Figure 2:
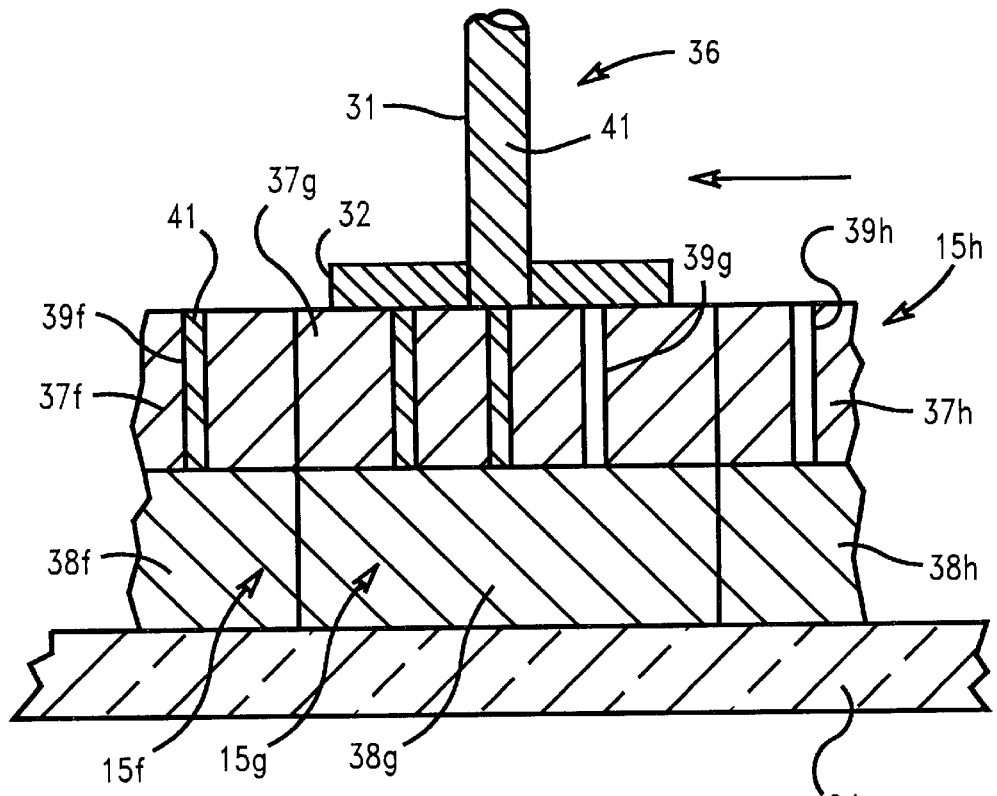
FIG. 2 is a schematic side view of a plurality of abutting molds advancing on the third (outlet) passageway of the preferred apparatus of the invention and of an injection molding apparatus filling a mold which is under the injection molding apparatus.
Figure 4:
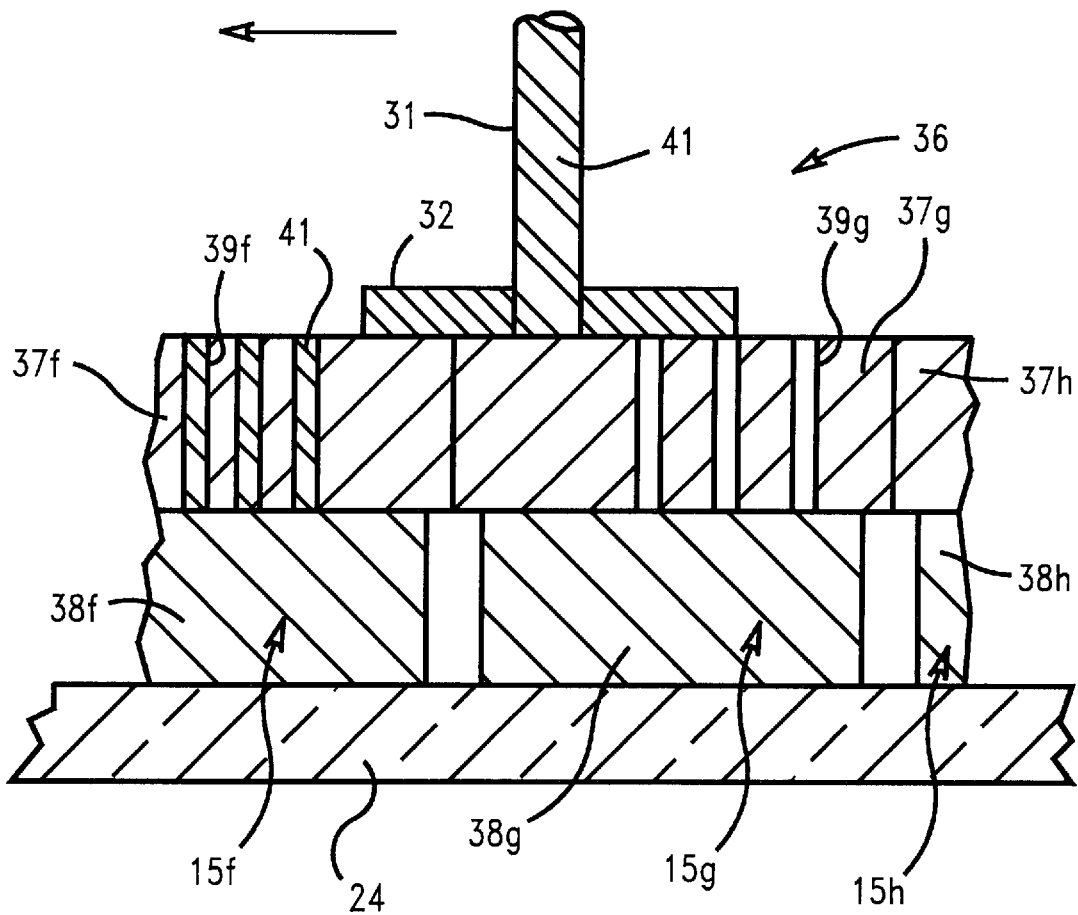
FIG. 4 is a schematic side view of a plurality of preferred molds at rest on the third (outlet) passageway of the apparatus.

With regard to FIG. 2 which shows the method of the invention in detail, a schematic cross-sectional illustration of the injection molding assembly 36 and molds 15f, 15g and 15h advancing on third passageway 24 in the direction of the arrow is shown. Each mold 15 comprises upper mold portions 37f, 37g and 37h having openings 39f, 39g and 39h therein. Openings 39f and two of openings 39g are shown filled with solder 41. As the molds are advanced, the last opening 39g will also be filled with solder and the mold will come to rest as shown in FIG. 4. Mold 15h is the next mold to be filled in FIG. 2 and 15g in FIG. 4. The openings form the solder columns or other desired solder solid configuration for placement on a substrate such as the pads on a semiconductor substrate. Shown in the figure is a corresponding base plate 38f, 38g and 38h which are securely attached to each upper mold portions 37 so that the flow of molten solder from solder assembly 36 fills only openings 39f, 39g and 39h of each mold 15. U.S. Pat. No. 5,244,143, supra shows details of the injection molding assembly and will not be described in detail here. The important aspect of this invention is that the molds 15 be placed sequentially in abutting relationship on a planar passageway, such as third passageway 24, and that the mold be filled with molten solder as the next sequential mold is advanced preferably pushed, by a shuttle arm assembly which moves a new mold a distance so that the preceding mold on the passageway is moved the distance of the length of the mold. A mold will then be properly positioned on the third passageway to be advanced for filling under injection molding assembly 36 when a new mold is introduced onto the passageway. This process will continue until all molds are filled with solder and the process completed.

Figure 3:
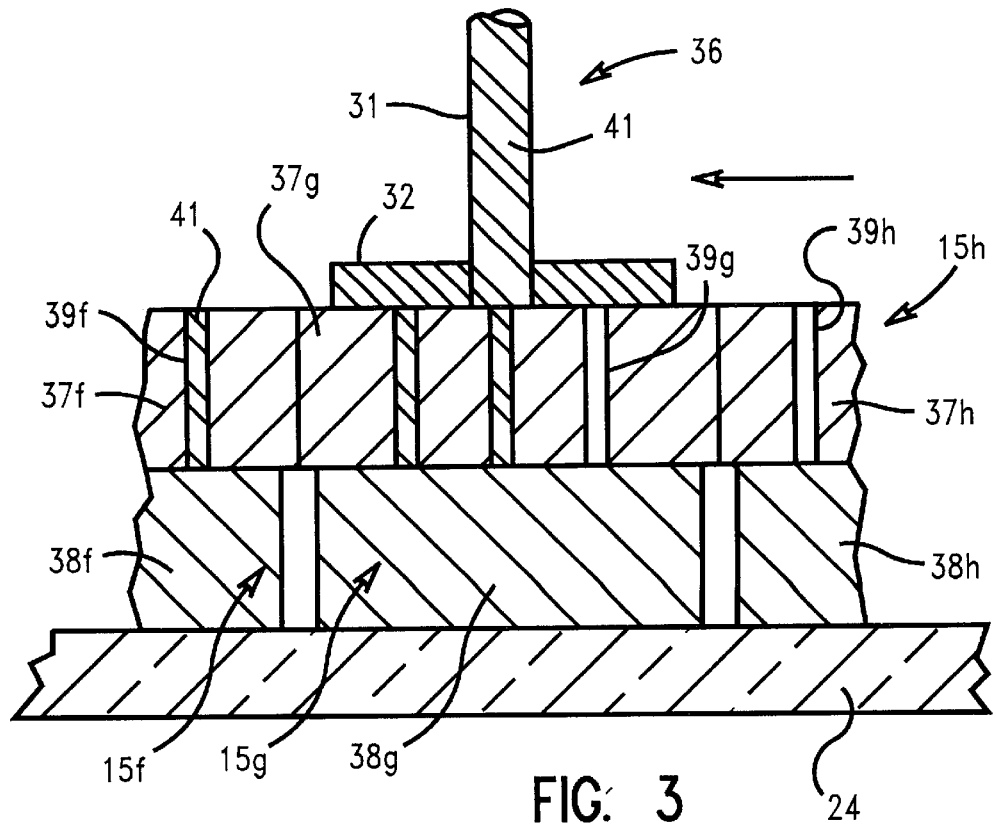
FIG. 3 is a schematic side view of a plurality of abutting molds advancing on the third (outlet) passageway of the preferred apparatus of the invention and of a preferred mold of the invention one of which is under an injection molding apparatus and is being injection molded with solder.

As shown in FIG. 3, and compared to FIG. 2, a preferred mold 15 of the invention is shown. Thus, mold 15 comprises and upper mold part 37f, 37g or 37h and a lower secured corresponding plate portion 38f, 38g or 38h. The X/Y dimensions of the upper mold portion 37 are slightly longer and wider than the plate portion 38 and it has been found that with this configuration essentially no solder is lost between sequentially molds processed on the apparatus of the invention. The mold is preferably both longer and wider by a length of about 0.01 inch, so that the upper mold extends over the lower plate about 0.005 inch on each side.

The mold may be made of any suitable material which is nonwettable by solder and is typically graphite, titanium, plastics and ceramic. Similarly, the backing plate 38 may be made from any suitable material and in the example shown is also graphite. The solder formed in the mold openings 39 will be transferred to another substrate such as a multilayer ceramic package. The backing plate 38 may be the substrate to which the solder mound will be transferred and in that case the connecting pads or other connectors on substrate 38 will be wettable by the solder and can be transferred easily from the upper position 37 of mold 15 to the substrate 38.

With regard to FIG. 4, molds 15f, 15g and 15h are shown at rest on third passageway 24. When the next mold 15g is to be filled, the molds are advanced under the injection plate 32 and reservoir and injection head 31 in the direction of the arrow as described above. After advancement of mold 15g the distance the length of the mold, openings 39f will be filled and mold 15h will be in the position for filling now shown for mold 15g.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for injecting molten solder into a plurality of molds from an assembly comprising a reservoir containing molten solder in communication with an injection head and an injection plate the method comprising:

advancing a plurality of molds having a leading edge and a trailing edge sequentially depending on a control signal determined by the processing rate desired along a U-shaped substantially horizontal planar passageway comprising a first passageway, an intersecting transverse second passageway and the second passageway intersecting a third passageway parallel to the first passageway;

advancing the molds along the first passageway to a first intersection at the intersection of the first and second passageways with a single mold being positioned in the first intersection;

advancing the single mold from the first intersection and other molds on the second passageway along the second passageway to a second intersection at the intersection of the second and third passageways with a single mold positioned in the second intersection;

advancing along the third passageway the leading edge of the single mold in the second intersection against a trailing edge of a mold positioned on the third passageway in abutting relationship to the other molds on the third passageway a distance whereby the trailing edge of the mold on the third passageway is moved a distance equal to the length of the single mold;

providing a reservoir containing molten solder in communication with an injection head and injection plate, the injection plate contacting the top of each mold and not being lifted therefrom during the method as each mold passes under the injection plate during advancement of the plurality of molds on the third passageway;

forcing molten solder into the mold advancing under the reservoir, injection head and injection plate and filling the mold with the molten solder;

generating a control signal to control advancing of the molds; and repeating the above steps until all the molds are advanced under the injection plate and are filled with solder.

2. The method of claim 1 wherein the molds have the same X, Y and Z dimensions.

3. The method of claim 2 wherein the molds have an upper plate and a backing or substrate plate and the upper plate of the mold has a longer X and longer Y dimension than the substrate or backing plate.

4. The method of claim 3 wherein both the X and Y dimensions are about 0.01 inch longer.

5. The method of claim 1 where the molds are advanced by a pushing mechanism.

6. An apparatus for continuous casting solder into openings in discrete molds comprises:

a U-shaped substantially horizontal planar passageway comprising a first passageway having an inlet at one end and an intersecting transverse second passageway at the other end of the first passageway and a third passageway parallel to the first passageway having an outlet at one end and intersecting the second passageway at the other end;

first advancing means for moving a plurality of molds having a leading edge and a trailing edge along the first passageway to a first intersection at the intersection of the first and second passageways in which first intersection a single mold is positioned;

second advancing means for moving the single mold in the first intersection and other molds on the second passageway along the second passageway to a second intersection at the intersection of the second and third passageways with a single mold positioned in the second intersection;

third advancing means for moving the leading edge of the single mold from the second intersection along the third passageway against the trailing edge of a mold positioned on the third passageway in abutting relationship to the other molds on the third passageway a distance whereby each mold on the third passageway is moved a distance equal to the length of the single mold;

molten solder means which rests on the surface of a mold on the third passageway and fills the mold with molten solder as the mold advances under the molten solder means, the molten solder means resting on the surface of each of the plurality of molds and not being lifted therefrom as the molds are advanced on the third passageway;

control means for controlling advancement of the molds; and removing the filled molds from the apparatus at the outlet means.

7. The apparatus of claim 6 wherein the molten solder means is an injecting molding assembly.

8. The apparatus of claim 7 wherein the advancing means are pushing mechanisms.

* * * * *